US011031072B2

(12) United States Patent
Sharma et al.

(10) Patent No.: US 11,031,072 B2
(45) Date of Patent: Jun. 8, 2021

(54) DYNAMIC RANDOM ACCESS MEMORY INCLUDING THRESHOLD SWITCH

(71) Applicant: Intel Corporation, Santa Clara, CA (US)

(72) Inventors: Abhishek A. Sharma, Hillsboro, OR (US); Ravi Pillarisetty, Portland, OR (US); Brian S. Doyle, Portland, OR (US); Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,574

(22) PCT Filed: Sep. 28, 2017

(86) PCT No.: PCT/US2017/054016
§ 371 (c)(1),
(2) Date: Feb. 24, 2020

(87) PCT Pub. No.: WO2019/066854
PCT Pub. Date: Apr. 4, 2019

(65) Prior Publication Data

US 2020/0251160 A1 Aug. 6, 2020

(51) Int. Cl.
*G11C 11/00* (2006.01)
*G11C 11/56* (2006.01)
(Continued)

(52) U.S. Cl.
CPC .... *G11C 11/4096* (2013.01); *H01L 27/10814* (2013.01); *G11C 11/005* (2013.01);
(Continued)

(58) Field of Classification Search
CPC . G11C 11/4096; G11C 14/009; G11C 11/005; G11C 11/40; G11C 13/0004;
(Continued)

(56) References Cited

U.S. PATENT DOCUMENTS

2006/0002173 A1* 1/2006 Parkinson ............ G11C 13/003 365/148
2006/0157689 A1* 7/2006 Czubatyj ............ H01L 45/1253 257/40
(Continued)

FOREIGN PATENT DOCUMENTS

KR 10-2015-011051 A 10/2015

OTHER PUBLICATIONS

International Search Report and Written Opinion dated Jun. 28, 2018 for International Patent Application No. PCT/US2017/054016; 13 pages.

*Primary Examiner* — Ly D Pham
(74) *Attorney, Agent, or Firm* — Schwabe, Williamson & Wyatt, P.C.

(57) ABSTRACT

Described herein are apparatuses, systems, and methods associated with a memory circuit that includes memory cells having respective threshold switches. The memory cells may include a selector transistor with a gate terminal coupled to a word line to receive a word line signal, a drain terminal coupled to a bit line to receive a bit line signal, and a source terminal coupled to a first terminal of the threshold switch. The threshold switch may switch from a high resistance state to a low resistance state when a voltage across the first terminal and a second terminal exceeds a threshold voltage and may remain in the low resistance state after switching when the voltage across the first and second
(Continued)

terminals is equal to or greater than a holding voltage that is less than the threshold voltage. Other embodiments may be described and claimed.

21 Claims, 7 Drawing Sheets

(51) Int. Cl.

| | |
|---|---|
| ***H01L 45/00*** | (2006.01) |
| ***H01L 47/00*** | (2006.01) |
| ***H01L 27/24*** | (2006.01) |
| ***G11C 13/00*** | (2006.01) |
| ***G11C 11/4096*** | (2006.01) |
| ***H01L 27/108*** | (2006.01) |
| *G11C 14/00* | (2006.01) |
| *G11C 11/40* | (2006.01) |

(52) U.S. Cl.
CPC .......... *G11C 11/40* (2013.01); *G11C 13/0004* (2013.01); *G11C 14/009* (2013.01); *H01L 27/2427* (2013.01); *H01L 45/00* (2013.01); *H01L 45/04* (2013.01); *H01L 45/06* (2013.01); *H01L 45/126* (2013.01); *H01L 45/1233* (2013.01); *H01L 45/141* (2013.01); *H01L 45/16* (2013.01); *H01L 45/1683* (2013.01)

(58) Field of Classification Search
CPC ........... H01L 27/10814; H01L 27/2427; H01L 45/00; H01L 45/06; H01L 45/04
USPC .................. 365/148, 163; 257/E27.004, 2, 5
See application file for complete search history.

(56) References Cited

U.S. PATENT DOCUMENTS

2006/0246712 A1* 11/2006 Kim ...................... H01L 45/141 438/622
2006/0278900 A1* 12/2006 Chang ................ H01L 27/2427 257/248
2007/0121371 A1* 5/2007 King .................... G11C 11/005 365/154
2008/0112217 A1* 5/2008 Karpov ............. G11C 13/0061 365/163
2011/0141798 A1 6/2011 Kuo et al.
2012/0181621 A1 7/2012 Bertin et al.
2014/0169062 A1* 6/2014 Lee ..................... G11C 13/003 365/148
2015/0145009 A1 5/2015 Namioka
2016/0163712 A1 6/2016 Anderson et al.
2019/0074429 A1* 3/2019 Karpov .............. G11C 11/1659
2020/0091156 A1* 3/2020 Sharma ............ H01L 29/78693

* cited by examiner

DYNAMIC RANDOM ACCESS MEMORY INCLUDING THRESHOLD SWITCH

CROSS REFERENCE TO RELATED APPLICATIONS

The present application is a national phase entry under 35 U.S.C. § 371 of International Application No. PCT/US2017/054016, filed Sep. 28, 2017, entitled "DYNAMIC RANDOM ACCESS MEMORY INCLUDING THRESHOLD SWITCH," which designated, among the various States, the United States of America, contents of which is hereby incorporated by reference in its entirety.

TECHNICAL FIELD

Embodiments of the disclosure are in the field of integrated circuit structures and, in particular, dynamic random access memory including a threshold switch.

BACKGROUND

Dynamic random access memory (DRAM) that is included on the same integrated circuit (IC) die as logic circuitry (e.g., logic transistors, such as a processor) is referred to as embedded DRAM (eDRAM). eDRAM cells typically include one front-end transistor and one capacitor. The capacitor requires specialized metal layers to implement, and is difficult or impractical to scale to smaller size.

DESCRIPTION OF THE EMBODIMENTS

Figure 1:
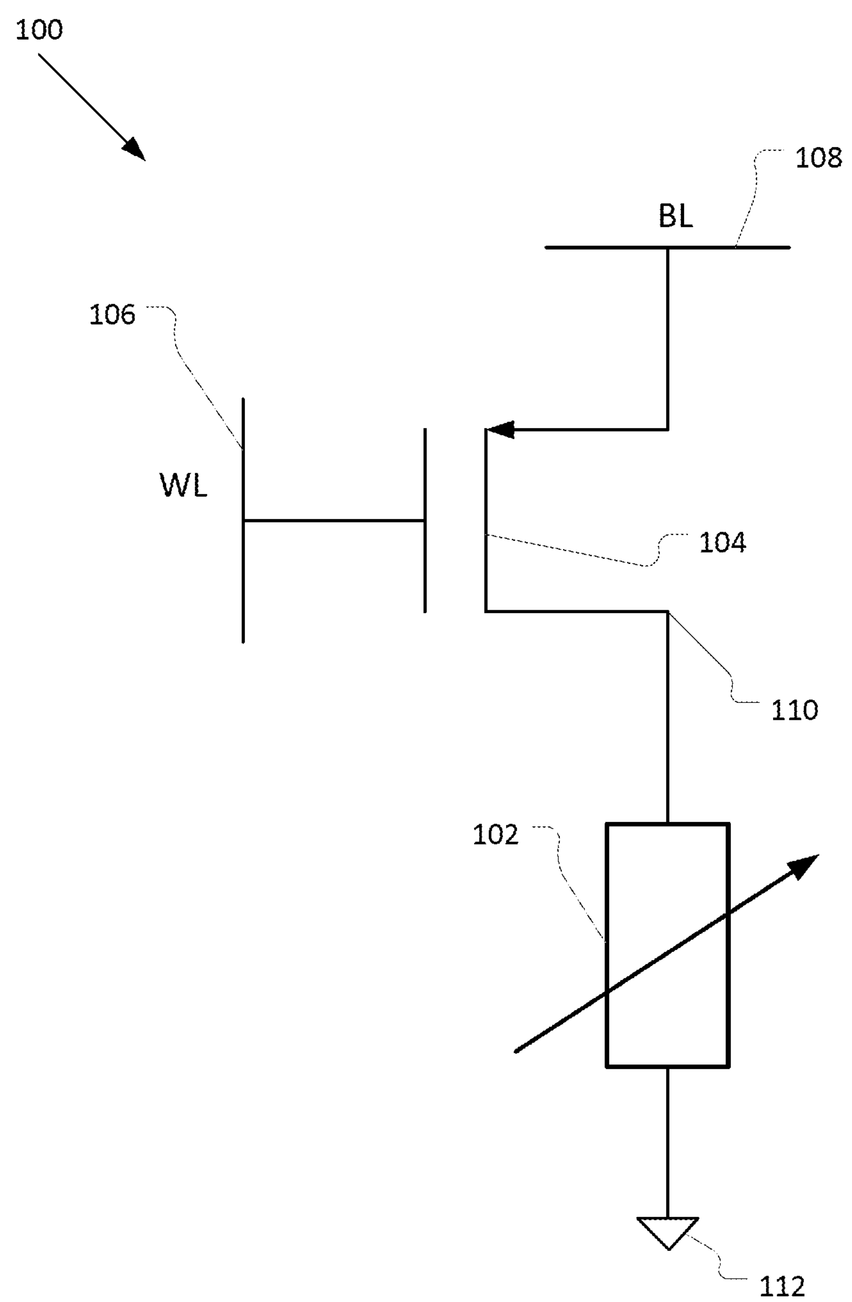
FIG. 1 schematically illustrates a memory cell including a threshold switch, in accordance with various embodiments.

Described herein is a memory circuit (e.g., an embedded dynamic random access memory (eDRAM) circuit) including a threshold switch, and associated methods, apparatuses, and systems. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Various embodiments described herein are directed to a memory circuit that includes memory cells having respective threshold switches to store data. In some embodiments, the memory circuit may be an embedded dynamic random access memory (eDRAM) circuit. That is, the eDRAM memory circuit may be included on the same IC die with logic circuitry (e.g., logic transistors, such as of a processor). Accordingly, the eDRAM memory may be included in a system-on-chip (SoC) implementation. Although the memory circuit is described herein with respect to eDRAM, other embodiments may use the memory cells described herein in other types of memory circuits, such as non-embedded DRAM.

The threshold switch described herein may also be referred to as an s-type negative differential resistor (S-NDR). The threshold switch may be a 2-terminal device having a channel layer between a first terminal and a second terminal. When the voltage across the first terminal and the second terminal of the threshold switch exceeds a threshold voltage, the threshold switch switches from a high resistance (e.g., insulating) state to a low resistance (e.g., conducting) state. After switching to the high resistance state, the threshold switch remains in the low resistance state so long as the voltage across the first and second terminals is equal to or greater than a holding voltage. The holding voltage may be equal to or less than the threshold voltage. When the voltage across the first and second terminals drops below the holding voltage, the threshold switch switches back to the low resistance state. The current between the first and second terminals may decay according to a time constant that is based on the amount that the applied voltage is less than the holding voltage. Accordingly, at an applied voltage that is slightly below the holding voltage, the current through the threshold switch may decay more slowly (e.g., similar to a capacitor) than at an applied voltage that is further below the holding voltage. These characteristics of the threshold switch may be exploited by the memory circuit described herein, as further discussed below.

In various embodiments, the channel layer of the threshold switch may be any suitable material that provides the threshold switch with the characteristics described above. For example, the channel layer of the threshold switch may include oxygen and niobium (e.g., $NbO_2$), oxygen and tantalum (e.g., $TaO_x$ with x from 1 to 2.3), oxygen and vanadium ($VO_2$), oxygen and nickel (e.g., NiO), hafnium and oxygen (e.g., $HfO_2$); and/or a chalcogenide (e.g., a chalcogenide including silicon, telluride, arsenic, antimony, and/or germanium). The channel layer may also include a composite of one or more of the oxides listed above or a composite of one or more of the chalcogenides listed above. In some embodiments, the oxide of the channel layer may be doped, for example, with platinum, gold, silver, tantalum, and/or carbon.

FIG. 1 illustrates a memory cell 100 in accordance with various embodiments. The memory cell 100 may be an eDRAM memory cell in some embodiments. The memory cell 100 may include a threshold switch 102 and a selector transistor 104. The memory cell 100 may further include a word line 106 to receive a word line signal and a bit line 108 to receive a bit line signal. The selector transistor 104 may have a source terminal coupled to the first terminal of the threshold switch, a gate terminal coupled to the word line 106 to receive the word line signal, and a drain terminal coupled to the bit line 108 to receive the bit line signal.

The threshold switch 102 may be a two-terminal threshold switch (e.g., S-NDR) as described above. A first terminal of the threshold switch 102 may be coupled to the source terminal of the selector transistor 104 at a data node 110. A second terminal of the threshold switch 102 may be coupled to ground 112. In some embodiments, a sense amplifier (not shown) may be coupled to the second terminal of the threshold switch 102 (e.g., between the second terminal and ground 112) to read the data bit from the memory cell 100.

The selector transistor 104 may be any suitable type of transistor, such as a metal-oxide-semiconductor field-effect transistor (MOSFET). The memory cell 100 is described herein with reference to an n-type transistor for the selector transistor 104. however, other embodiments may use a p-type transistor for the selector transistor 104. The selector transistor 104 may be a front-end (i.e., FEOL) transistor (e.g., a planar or non-planar transistor) or a back-end (i.e., BEOL) transistor (e.g., a thin-film transistor (TFT). For example, the selector transistor 104 may be an FEOL transistor with a channel formed of any suitable material, such as silicon, silicon and germanium (e.g., SiGe), or germanium. Alternatively, the selector transistor 104 may be a back-end transistor with a channel layer formed of any suitable material, such as zinc and oxygen (e.g., ZnO); indium and oxygen (e.g., $InO_x$ with x from 0.5 to 2); indium, tin, and oxygen (e.g., ITO); aluminum, zinc, and oxygen (e.g., AZO), indium, zinc, and oxygen (e.g., IZO); indium, gallium, zinc, and oxygen (IGZO); gallium, zinc, and oxygen (e.g., GZO); gallium and oxygen (e.g., GO); tin and oxygen (e.g., SnO); cobalt and oxygen (e.g., CoO); nickel and oxygen (e.g., NiO); copper and oxygen (e.g., CuO and/or $Cu_2O$); titanium and oxygen (e.g., $TiO_x$ with x from 0.5 to 2); amorphous silicon; amorphous germanium; polysilicon; poly germanium doped with boron; poly germanium doped with aluminum; poly germanium doped with phosphorous; poly germanium doped with arsenic; tungsten disulphide; molybdenum disulphide; molybdenum selenide; black phosphorus; indium antimonide; graphene; graphyne; borophene; germanene; silicene; $Si_2BN$; stanene; phosphorene; molybdenite; poly-III-V material such as InAs, InGaAs, or InP; amorphous InGaZnO (a-IGZO); crystal-like InGaZnO (c-IGZO); GaZnON; ZnON; and/or C-Axis Aligned Crystal (CAAC).

Figure 2:
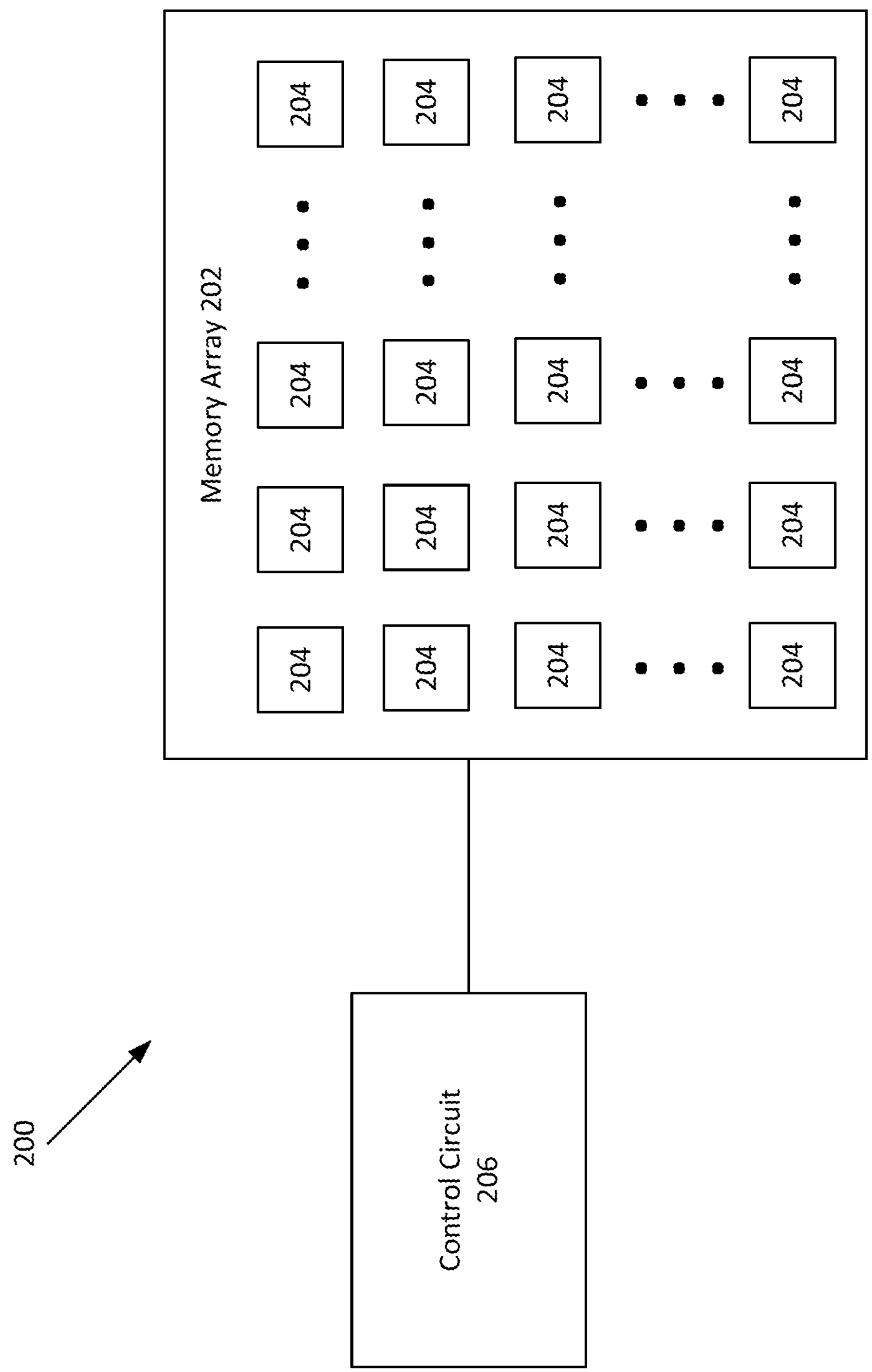
FIG. 2 schematically illustrates a memory circuit including a plurality of the memory cells of FIG. 1, in accordance with various embodiments.

FIG. 2 illustrates a memory circuit 200 in accordance with various embodiments. The memory circuit 200 may be an eDRAM memory circuit in some embodiments. The memory circuit 200 may include a memory array 202 including a plurality of memory cells 204. The memory cells 204 may correspond to the memory cell 100 of FIG. 1. The memory cells 204 may be arranged in rows and columns, with memory cells 204 of the same column coupled to the same word line (e.g., word line 106), and memory cells 204 of the same row coupled to the same bit line (e.g., bit line 108). Alternatively, memory cells 204 of the same column may be coupled to the same word line and memory cells 204 of the same row may be coupled to the same bit line.

In various embodiments, the memory circuit 200 may further include a control circuit 206. The control circuit 206 may generate and/or provide a word line signal to respective word lines of the memory array 202 and a bit line signal to respective bit lines of the memory array 202 to perform one or more operations, such as a write operation, a read operation, a refresh operation, and/or an erase operation.

Referring again to FIG. 1, the threshold switch 102 may store a data bit based on the resistance state of the threshold switch 102. For example, the threshold switch 102 may switch from a high resistance state that represents a first logic value (e.g., logic 1) for the data bit to a low resistance state that represents a second logic value (e.g., logic 0) for the data bit when a voltage across the first and second terminals exceeds a threshold voltage.

During a write operation, the word line signal may turn on the selector transistor 104 to write a data bit to the data node 110 having a logic value based on the voltage level of the bit line signal. For example, the bit line signal may be above the threshold voltage of the threshold switch 102 (e.g., may be equal to the supply voltage VDD) to write the data bit with the first logic value (e.g., logic 1) and may be below the threshold voltage of the threshold switch 102 (e.g., may be about 0 Volts) to write the data bit with the second logic value (e.g., logic 0). Put another way, to write a data bit with the second logic value, the word line signal and the bit line signal may control the selector transistor 104 to apply a first voltage to the first terminal that is equal to or greater than the threshold voltage and then apply a second voltage to the first terminal that is less than the first voltage to maintain the threshold switch in the high resistance state. In some embodiments, the second voltage may be less than the threshold voltage. For example, the second voltage may be less than the threshold voltage and equal to or greater than the holding voltage. In other embodiments, the second voltage may be less than the holding voltage, such that the voltage stored at the data node 110 may decay by a time constant. For example, the second voltage may be selected so that the decay is slow enough that the voltage at the data node can be refreshed (e.g., by the refresh operation) within a reasonable amount of time for efficient operation of the memory circuit.

As an example, to write a data bit to the memory cell 100 with the second logic value (e.g., logic 0), the bit line signal may be at a supply voltage (e.g., VDD). Additionally, the word line signal may be increased (e.g., by the control circuit 206) to the supply voltage (e.g., VDD) to turn on the selector transistor 104. Accordingly, the voltage at the data node 110 may increase to the threshold voltage and the threshold switch 102 may switch to the low resistance state. The word line signal may then be decreased (e.g., by the control circuit 206) to an intermediate voltage that is less than the supply voltage. The intermediate voltage may be sufficient to provide the data node 110 with the second voltage to maintain the threshold switch 102 in the low resistance state and thereby maintain the data bit written to the data node 110. In some embodiments, the bit line signal may remain at the supply voltage to maintain the threshold switch 102 in the low resistance state.

The value of the intermediate voltage may be based on the type and/or attributes of the transistor used for the selector transistor 104. In one example, the supply voltage may be about 2.2 V, and the intermediate voltage may be about 2.0 V. It will be apparent that many other values for the supply voltage and/or intermediate voltage are possible.

To read the data bit from the memory cell 100, the bit line signal may be reduced to a read voltage. Additionally, the word line signal may be increased to the supply voltage to turn on the selector transistor 104. A sense amplifier (not shown) may be coupled to the second terminal to detect the logic value of the data bit, for example, based on the current through the threshold switch 102. For example, if the data bit has the second logic value, the threshold switch 102 will be in the low resistance state and current will flow through the threshold switch 102. However, if the data bit has the first logic value, the threshold switch 102 will be in the high resistance state and current will not flow through the threshold switch 102.

In various embodiments, the read voltage may have a voltage that is less than the threshold voltage of the threshold switch 102 (e.g., less than the first voltage level). Accordingly, the threshold switch 102 may not switch to the low resistance state from the high resistance state responsive to the read operation (e.g., if the data bit is the first logic value). In some embodiments, the read voltage may have a value that is between the first voltage level and the second voltage level (e.g., between the threshold voltage and the holding voltage). Accordingly, if the data bit has the second logic value, current may flow from the bit line 108 to the data node 110. This may effectively recharge the voltage at the data node 110 to maintain the logic state of the data bit. The refresh operation may use the same or a similar process as the read operation to maintain the logic state of the data bit, e.g., to account for any decay in the voltage level at the data node 110. In other embodiments, the read voltage may have any suitable value that is less than the threshold voltage, such as a voltage of 0 V to the threshold voltage. The read voltage may be configured so that it will not cause the threshold switch 102 to turn on from the off state.

To write a data bit with the first logic value (e.g., logic 0), the bit line signal may be set at 0 Volts, and the word line signal may turn on the selector transistor 104. Accordingly, voltage level at the data node 110 will go to or remain at 0 Volts, and the threshold switch 104 will be in the high resistance state. The word line signal may be reduced to the intermediate voltage after the write operation whether or not the associated data bit was written to the first logic value or the second logic value (e.g., to maintain the second voltage at the data nodes of other memory cells coupled to the same word line 106 that may store data bits with the second logic value).

The memory cell 100 and memory circuit 200 described herein provide several advantages over prior memory circuits, including prior eDRAM circuits. For example, the threshold switch 102 of the memory cell 100 is readily scalable to smaller sizes than are possible with capacitors, and do not require the custom metal layers required by capacitors. Additionally, the memory cell 100 requires a low holding voltage and exhibits low leakage compared with memory cells that utilize a capacitor. Furthermore, the retention of data in the memory cell 100 is independent of current, and the decay/retention time of the memory cell 100 is uncorrelated with leakage in the selector transistor 104. In contrast, as transistor size decreases in memory cells that utilize a selector transistor and a capacitor, the transistor leakage increases which requires a larger capacitor. Additionally, the metal pitch increases at higher metal layers and there are currently no via processes available for capacitors, making scaling of the capacitors challenging.

Figure 3:
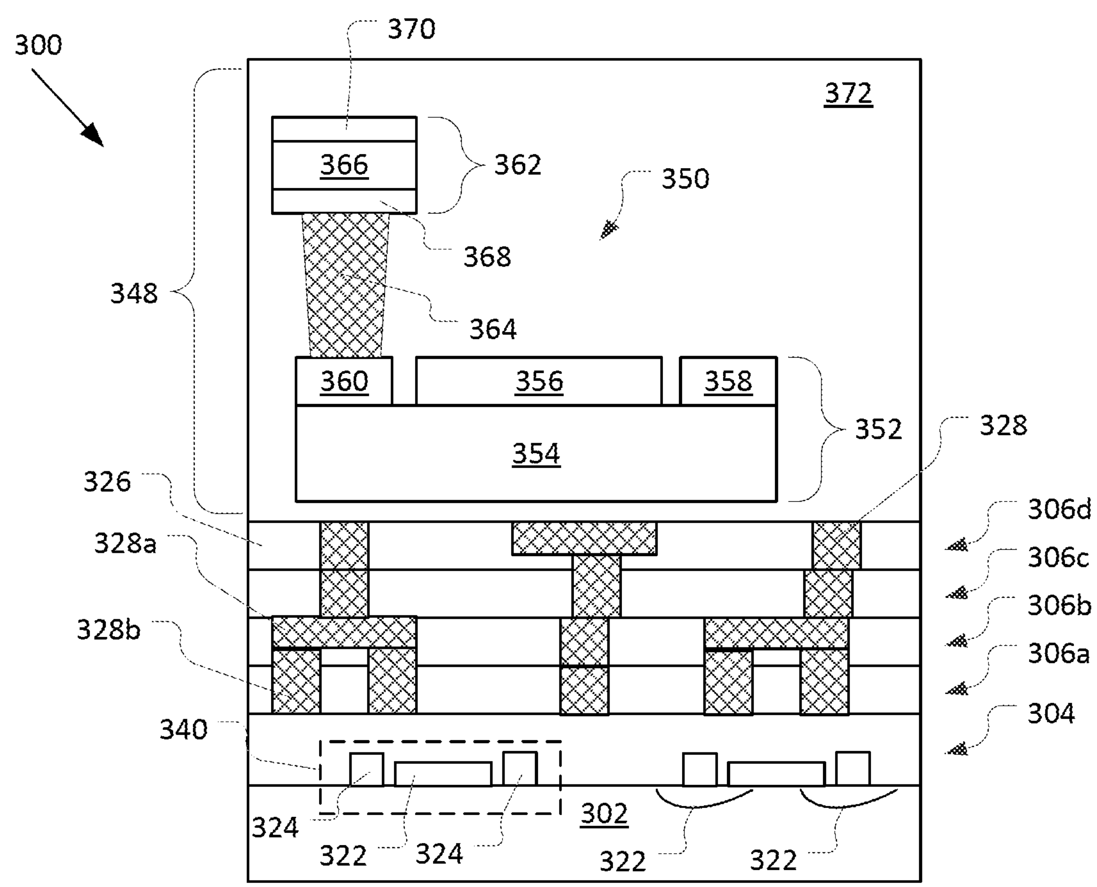
FIG. 3 illustrates a cross-sectional view of an integrated circuit die including the memory cell of FIG. 1 in accordance with some embodiments.

FIG. 3 is a cross-sectional side view of an integrated circuit (IC) device 300 that may include one or more memory cells 340 (e.g., corresponding to memory cell 100 of FIG. 1), in accordance with one or more of the embodiments disclosed herein. The memory cell 350 depicted in FIG. 3 may include a selector transistor 352 that is formed in the back-end of IC device 300, as further discussed below.

Referring to FIG. 3, an IC device 300 is formed on a substrate 302 (e.g., the wafer 500 of FIG. 5, further discussed below) and may be included in a die (e.g., the die 502 of FIG. 6, further discussed below), which may be singulated or included in a wafer. Although a few examples of materials from which the substrate 302 may be formed are described, any material that may serve as a foundation for an IC device 300 may be used.

The IC device 300 may include one or more device layers, such as device layer 304, disposed on the substrate 302. The device layer 304 may include features of one or more transistors 340 (e.g., logic transistors, memory selector transistors, and/or other types of transistors, as discussed herein) formed on the substrate 302. The device layer 304 may include, for example, one or more source and/or drain (S/D) regions 320, a gate 322 to control current flow in the transistors 340 between the S/D regions 320, and one or more S/D contacts 324 to route electrical signals to/from the S/D regions 320. The transistors 340 may include additional features not depicted for the sake of clarity, such as device isolation regions, gate contacts, and the like. The transistors 340 are not limited to the type and configuration depicted in FIG. 3 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors.

Electrical signals, such as power and/or input/output (I/O) signals, may be routed to and/or from the transistors 340 of the device layer 304 through one or more interconnect layers 306*a-d* disposed on the device layer 304. For example, electrically conductive features of the device layer 304 (e.g., the gate 322 and the S/D contacts 324) may be electrically coupled with the interconnect structures 328 of the interconnect layers 306*a-d*. The one or more interconnect layers 306*a-d* may form an interlayer dielectric (ILD) stack of the IC device 300.

The interconnect structures 328 may be arranged within the interconnect layers 306*a-d* to route electrical signals according to a wide variety of designs (in particular, the arrangement is not limited to the particular configuration of interconnect structures 328 depicted in FIG. 3). Although a particular number of interconnect layers 306*a-d* is depicted in FIG. 3, embodiments of the present disclosure include IC devices having more or fewer interconnect layers than depicted.

In some embodiments, the interconnect structures 328 may include trench structures 328*a* (sometimes referred to as "lines") and/or via structures 328*b* filled with an electrically conductive material such as a metal. The trench structures 328*a* may be arranged to route electrical signals in a direction of a plane that is substantially parallel with a surface of the substrate 302 upon which the device layer 304 is formed. For example, the trench structures 328*a* may route electrical signals in a direction in and out of the page from the perspective of FIG. 3. The via structures 328*b* may be arranged to route electrical signals in a direction of a plane that is substantially perpendicular to the surface of the substrate 302 upon which the device layer 304 is formed. In some embodiments, the via structures 328*b* may electrically couple trench structures 328*a* of different interconnect layers 306*a-d* together.

The interconnect layers 306*a-d* may include a dielectric material 326 disposed between the interconnect structures 328, as shown in FIG. 3. In some embodiments, the dielectric material 326 disposed between the interconnect structures 328 in different ones of the interconnect layers 306*a-d* may have different compositions; in other embodiments, the composition of the dielectric material 326 between different interconnect layers 306*a-d* may be the same. In either case, such dielectric materials may be referred to as inter-layer dielectric (ILD) materials.

A first interconnect layer 306*a* (referred to as Metal 1 or "M1") may be formed directly on the device layer 304. In some embodiments, the first interconnect layer 306*a* may include trench structures 328*a* and/or via structures 328*b*, as shown. The trench structures 328*a* of the first interconnect layer 306*a* may be coupled with contacts (e.g., the S/D contacts 324) of the device layer 304.

A second interconnect layer 306*b* (referred to as Metal 2 or "M2") may be formed directly on the first interconnect layer 306*a*. In some embodiments, the second interconnect layer 306*b* may include via structures 328*b* to couple the trench structures 328*a* of the second interconnect layer 306*b* with the trench structures 328*a* of the first interconnect layer 306*a*. Although the trench structures 328*a* and the via structures 328*b* are structurally delineated with a line within each interconnect layer (e.g., within the second interconnect layer 308) for the sake of clarity, the trench structures 328*a* and the via structures 328*b* may be structurally and/or materially contiguous (e.g., simultaneously filled during a dual-damascene process) in some embodiments.

In some embodiments, a third interconnect layer 310 (referred to as Metal 3 or "M3") and a fourth interconnect layer 306*d* (referred to as Metal 4 or "M4") (and additional interconnect layers, as desired) may be formed in succession on the second interconnect layer 306*b* according to similar techniques and configurations described in connection with the second interconnect layer 306*b* or the first interconnect layer 306*a*.

In various embodiments, the memory cell 350 may include a selector transistor 352 that is formed in the back-end (e.g., in a back-end stack 348) of the IC device 300, e.g., above one or more of the interconnect layers 306*a-d*. The selector transistor 352 may correspond to the selector transistor 104 of memory cell 100 described with respect to FIG. 1. As discussed herein, the selector transistor 352 may be a TFT. The selector transistor 352 may include a channel 354, a gate terminal 356, a drain terminal 358, and a source terminal 360. Each of the gate terminal 356, drain terminal 358, and source terminal 360 may include one or more layers (e.g., a "stack") as appropriate. The memory cell 350 may further include a threshold switch (e.g., S-NDR) 362 coupled to the source terminal 360 (e.g., by a via 364). The threshold switch 362 may include a channel layer 366 between a first terminal 368 and a second terminal 370, as described herein.

The back-end stack 348 of the IC device 300 may further include a dielectric material 372. The dielectric material 372 may include one or more material layers, and may include the same or a different material from the dielectric material 326.

In some embodiments, one or more additional layers (not shown) may be formed above the memory cell 350, such as one or more passive devices (inductors, capacitors, resistors) and/or one or more additional interconnect layers.

As shown in FIG. 3, when the memory cell 350 includes a back-end transistor 352, it does not consume area of the device layer 304, thereby freeing up area of the device layer 304 for transistors 340 (e.g., logic transistors).

Figure 4:
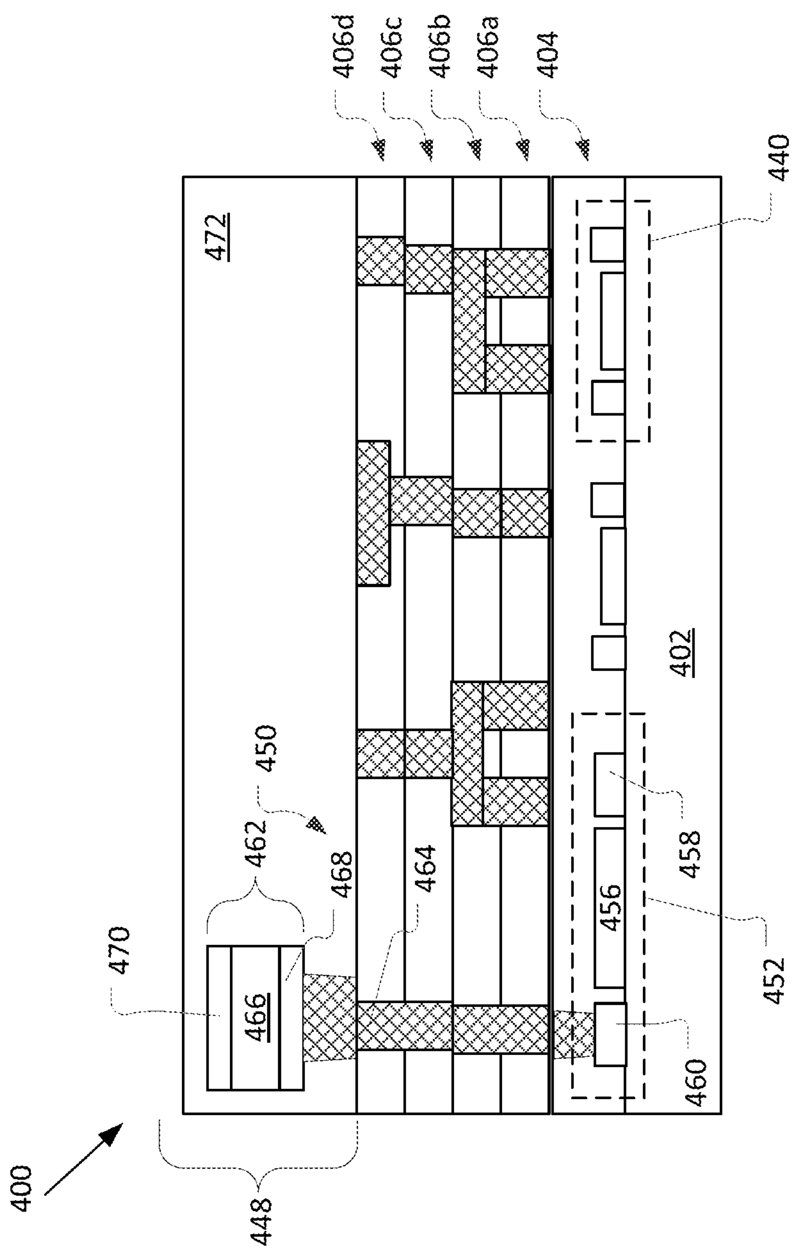
FIG. 4 illustrates a cross-sectional view of an integrated circuit die including the memory cell of FIG. 1 in accordance with some other embodiments.

FIG. 4 illustrates another embodiment of an IC device 400 that includes a memory cell 450 with a transistor 452 that is formed in the front end of the IC device 400, in accordance with one or more of the embodiments described herein.

The IC device 400 may further include a substrate 402, a device layer 404, interconnect layers 406*a-d*, and/or transistors 440 similar to the corresponding structures of IC device 300. The description of these structures will not be repeated here.

In various embodiments, the transistor 452 may be formed in the device layer 404 on the substrate 402. The transistor 452 may include a gate terminal 456, a drain terminal 458, and a source terminal 460 formed on the substrate 402. Each of the gate terminal 456, drain terminal 458, and source terminal 460 may include one or more layers (e.g., a "stack") as appropriate. The transistor 452 may use the substrate 402 as the channel, as described above. The transistor 452 may be any suitable type of transistor, such as a planar or non-planar transistor.

In various embodiments, the memory cell 450 may further include a threshold switch (e.g., S-NDR) 462 coupled to the source terminal 460 (e.g., by a via 464). The threshold switch 462 may include a channel layer 466 between a first terminal 468 and a second terminal 470, as described herein.

The threshold switch 462 may be formed in the back end stack 448 of the IC device 400 (e.g., above the interconnect layers 406*a-d*), and coupled to the source terminal 460 (by the via 464) through the interconnect layers 406*a-d*.

In various embodiments, the IC device 300 and/or 400 may be formed on a respective dies of a wafer. For example, FIGS. 5 and 6 are top views of a wafer and dies that include one or more memory cells and/or memory circuits, in accordance with any of the embodiments disclosed herein.

Figure 6:
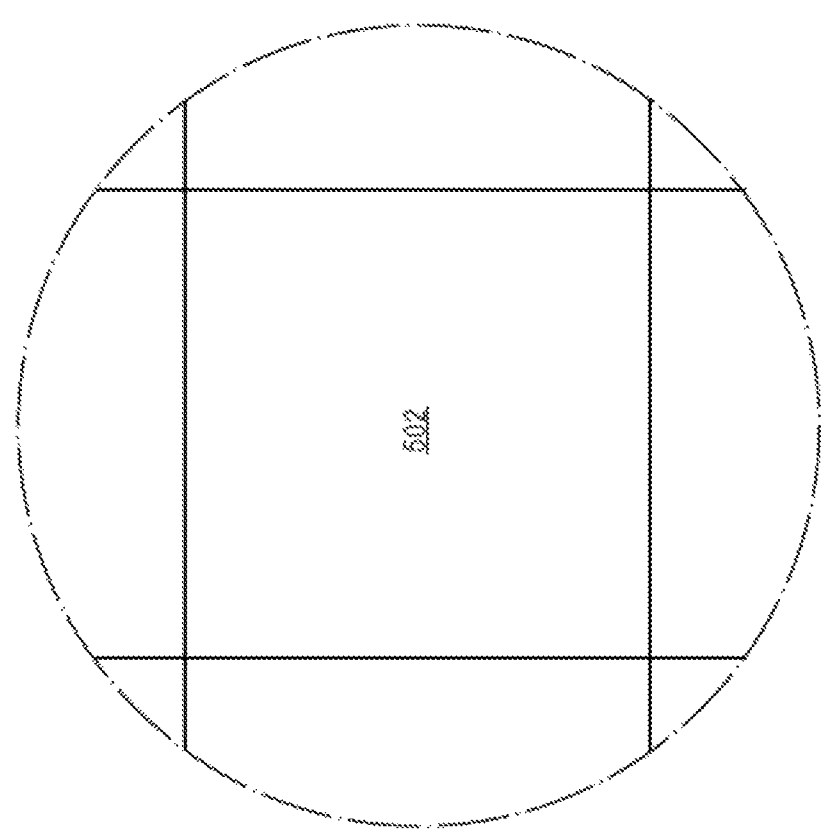
FIGS. 5 and 6 are top views of a wafer and dies that include a memory circuit, in accordance with one or more of the embodiments disclosed herein.
Figure 5:
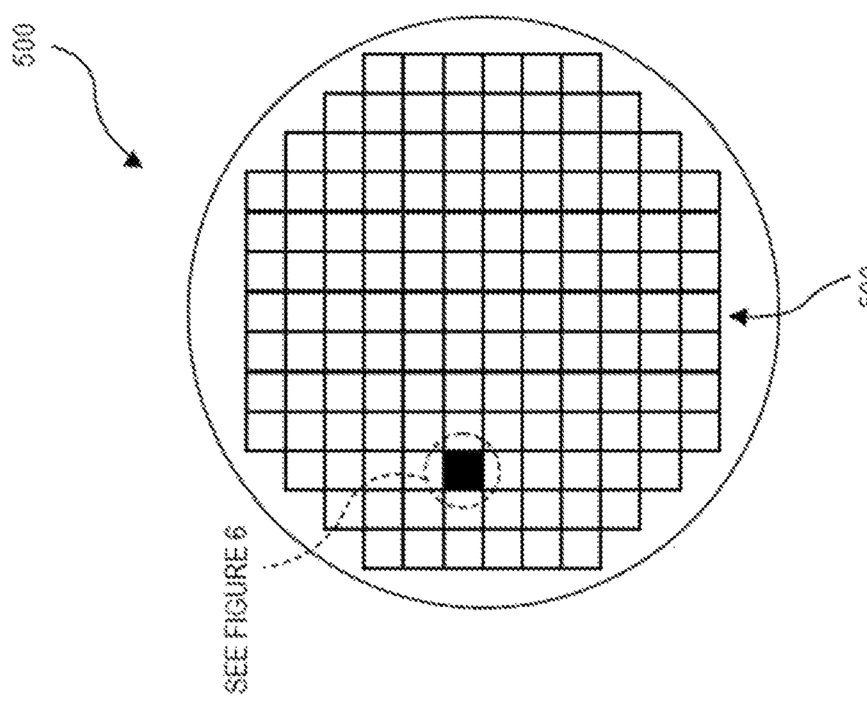

Referring to FIGS. 5 and 6, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., memory cell 100, memory circuit 200, IC device 300, and/or IC device 400). After the fabrication of the semiconductor product is complete, the wafer 500 may undergo a singulation process in which each of the dies 502 is separated from one another to provide discrete "chips" of the semiconductor product. In particular, devices that include the memory circuit as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 7:
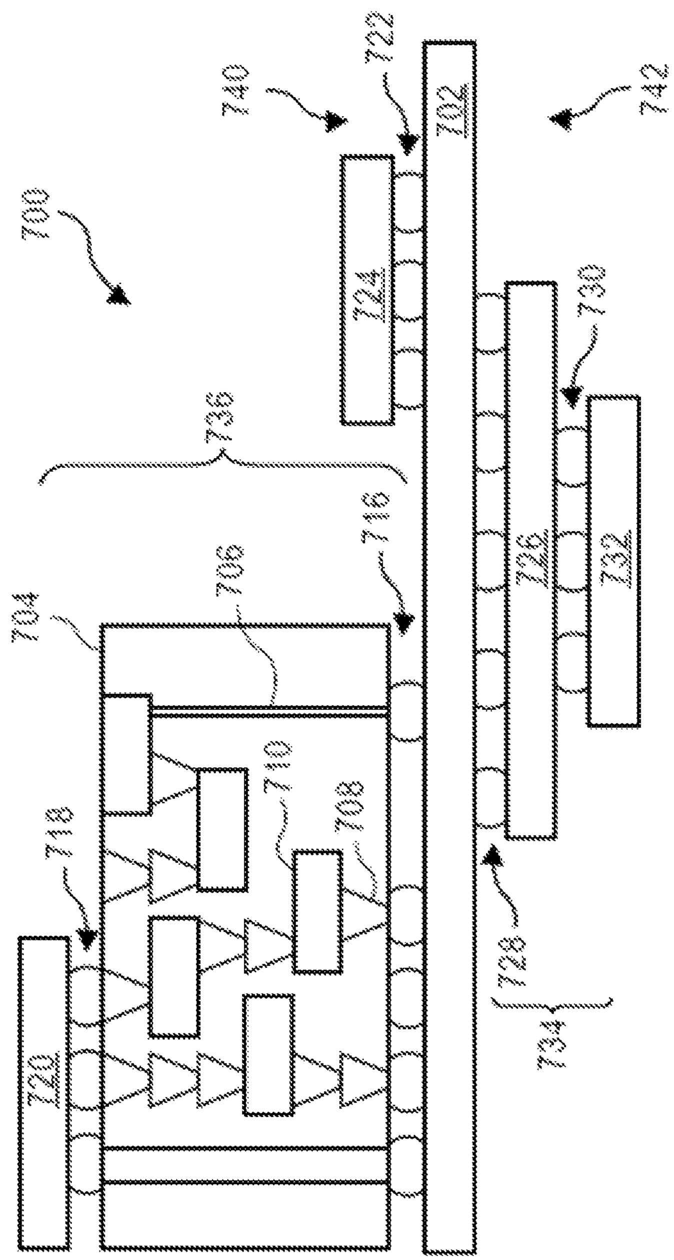
FIG. 7 is a cross-sectional side view of an integrated circuit (IC) device assembly that may include a memory circuit, in accordance with one or more of the embodiments disclosed herein.

FIG. 7 is a cross-sectional side view of an integrated circuit (IC) device assembly that may include a memory circuit in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include one or more of the memory cells 100, memory circuit 200, IC device 300, and/or IC device 300 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 6), an IC device (e.g., the IC device 300 of FIG. 3 or the IC device 400 of FIG. 4), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
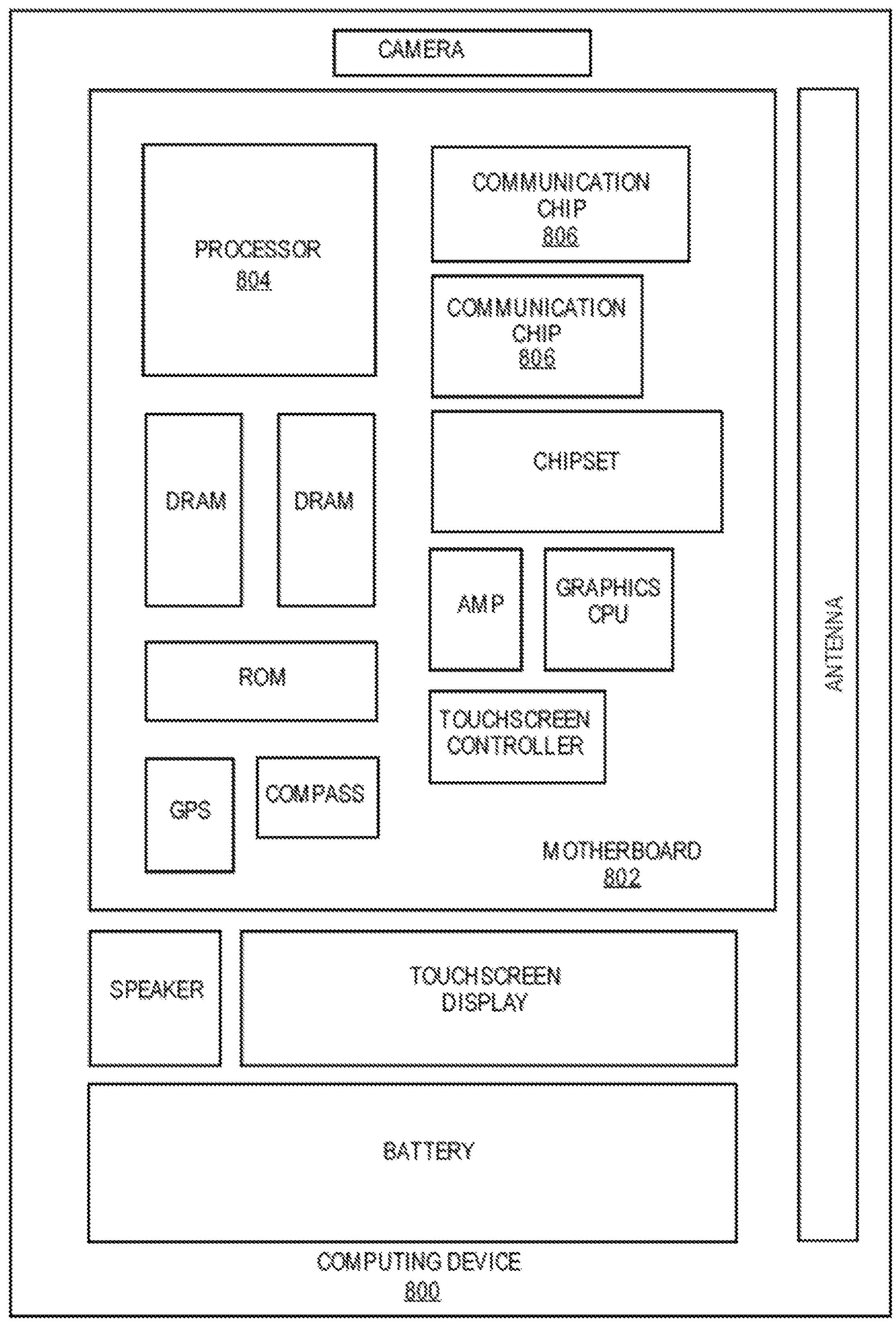
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes a memory circuit having memory cells with threshold switches, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes a memory circuit having memory cells with threshold switches, in accordance with implementations of embodiments of the disclosure.

In further implementations, another component housed within the computing device 800 may contain an integrated circuit die that includes a memory circuit having memory cells with threshold switches, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples of various embodiments are described below.

Example 1 is a memory circuit comprising: a word line to receive a word line signal; a bit line to receive a bit line signal; a selector transistor having a gate terminal coupled to the word line, a source terminal coupled to the bit line, and a drain terminal; and a threshold switch having a channel layer between a first terminal and a second terminal, wherein the first terminal is coupled to the drain terminal of the selector transistor, and wherein the threshold switch is to switch from a high resistance state that represents a first logic value for a data bit to a low resistance state that represents a second logic value for the data bit when a voltage across the first and second terminals exceeds a threshold voltage and is to remain in the low resistance state after switching when the voltage across the first and second terminals is equal to or greater than a holding voltage that is less than the threshold voltage.

Example 2 is the memory circuit of Example 1, wherein, to write the data bit with the second logic value, word line signal and the bit line signal are to control the selector transistor to apply a first voltage to the first terminal that is equal to or greater than the threshold voltage and then apply a second voltage to the first terminal that is less than the first voltage to maintain the threshold switch in the high resistance state.

Example 3 is the memory circuit of Example 2, wherein the second voltage is less than the threshold voltage.

Example 4 is the memory circuit of Example 2, wherein the word line signal is to have a higher voltage to control the selector transistor to provide the first voltage than to control the selector transistor to provide the second voltage.

Example 5 is the memory circuit of Example 2, wherein, to read the data bit from the threshold switch, the bit line signal is to have a read voltage that is between the first voltage and the second voltage.

Example 6 is the memory circuit of any one of Examples 1 to 5, wherein the threshold switch is a two-terminal device including the first terminal and the second terminal.

Example 7 is the memory circuit of Example 6, wherein the channel layer of the threshold switch includes oxygen and further includes niobium, tantalum, vanadium, nickel, or hafnium.

Example 8 is the memory circuit of Example 7, wherein the channel layer of the threshold switch is doped with platinum, gold, silver, tantalum, or carbon.

Example 9 is the memory circuit of Example 6, wherein the channel layer of the threshold switch includes a chalcogenide.

Example 10 is the memory circuit of Example 9, wherein the chalcogenide includes silicon, telluride, arsenic, antimony, or germanium.

Example 11 is the memory circuit of Example 1, wherein the word line signal and the bit line signal are to periodically refresh the data bit stored by the threshold switch.

Example 12 is the memory circuit of Example 1, further comprising a control circuit to provide the bit line signal to the bit line and the word line signal to the word line.

Example 13 is the memory circuit of Example 1, wherein the selector transistor is a front-end transistor.

Example 14 is the memory circuit of Example 1, wherein the selector transistor is a back end transistor.

Example 15 is the memory circuit of Example 1, wherein the memory circuit is an embedded dynamic random access memory (eDRAM) circuit on a same die as logic transistors.

Example 16 is a memory circuit comprising: a memory array including a plurality of memory cells. Individual memory cells of the plurality of memory cells include: a selector transistor having a gate terminal coupled to a word line to receive a word line signal, a source terminal coupled to a bit line to receive a bit line signal, and a drain terminal; and a two-terminal threshold switch having a channel layer between a first terminal and a second terminal, wherein the first terminal is coupled to the drain terminal of the selector transistor at a data node to store a data bit. The memory circuit of Example 16 further comprises a control circuit coupled to the memory array, the control circuit to provide the word line signal with a supply voltage during a write operation to write the data bit to the respective memory cell and to provide the word line signal with an intermediate voltage that is non-zero and less than the supply voltage after the write operation to retain the data bit in the respective memory cell.

Example 17 is the memory circuit of Example 16, wherein, during the write operation, the control circuit is to provide the bit line signal with a voltage level that corresponds to a logic value of the data bit to be written to the respective memory cell by the write operation.

Example 18 is the memory circuit of Example 16, wherein the threshold switch is to switch between a high resistance state that represents a first logic value for the data bit and a low resistance state that represents a second logic value for the data bit, and wherein the threshold switch is to switch from the high resistance state to the low resistance state when a voltage between the first and second terminals exceeds a threshold voltage and is to remain in the low resistance state after switching when the voltage between the first and second terminals is equal to or greater than a holding voltage that is less than the threshold voltage.

Example 19 is the memory circuit of Example 18, wherein the write operation is to write the data bit with the second logic value, and wherein the control circuit is to provide the bit line signal with the supply voltage during the write operation to write the data bit to the respective memory cell and after the write operation to retain the data bit in the respective memory cell.

Example 20 is the memory circuit of Example 19, wherein the supply voltage of the word line signal is to control the selector transistor to apply a first voltage to the threshold switch that is equal to or greater than the threshold voltage during the write operation, and wherein the intermediate voltage of the word line is to control the selector transistor to apply a second voltage to the threshold switch that is less than the threshold voltage to retain the data bit in the respective memory cell after the write operation.

Example 21 is the memory circuit of Example 20, wherein the second voltage is less than the holding voltage.

Example 22 is the memory circuit of Example 20, wherein, during a read operation to read the data bit from the respective memory cell, the bit line signal is to have a read voltage that is between the threshold voltage and the second voltage.

Example 23 is the memory circuit of any one of Examples 16 to 22, wherein the channel layer of the threshold switch includes: oxygen and further includes niobium, tantalum, vanadium, nickel, or hafnium; or a chalcogenide.

Example 24 is the memory circuit of any one of Examples 16 to 22, wherein the selector transistor is a front-end transistor.

Example 25 is the memory circuit of any one of Examples 16 to 22, wherein the selector transistor is a back-end transistor.

Example 26 is the memory circuit of any one of Examples 16 to 22, wherein the memory circuit is an embedded dynamic random access memory (eDRAM) circuit on a same die as logic transistors.

Example 27 is a computing system comprising: a circuit board; and a system-on-chip (SoC) coupled to the circuit board. The SoC includes: a processor; and an embedded dynamic random access memory (eDRAM) circuit coupled to the processor. The eDRAM circuit includes a memory array including a plurality of memory cells, wherein individual memory cells of the plurality of memory cells include: a selector transistor having a gate terminal coupled to a word line to receive a word line signal, a source terminal coupled to a bit line to receive a bit line signal, and a drain terminal; and a two-terminal threshold switch having a channel layer between a first terminal and a second terminal, wherein the first terminal is coupled to the drain terminal of the selector transistor at a data node to store a data bit. The eDRAM circuit further includes a control circuit coupled to the memory array, the control circuit to provide the word line signal with a supply voltage during a write operation to write the data bit to the respective memory cell and to provide the word line signal with an intermediate voltage that is non-zero and less than the supply voltage after the write operation to retain the data bit in the respective memory cell.

Example 28 is the system of Example 27, wherein, during the write operation, the control circuit is to provide the bit line signal with a voltage level that corresponds to a logic value of the data bit to be written to the respective memory cell by the write operation.

Example 29 is the system of Example 27, wherein the threshold switch is to switch between a high resistance state that represents a first logic value for the data bit and a low resistance state that represents a second logic value for the data bit, and wherein the threshold switch is to switch from the high resistance state to the low resistance state when a voltage between the first and second terminals exceeds a threshold voltage and is to remain in the low resistance state after switching when the voltage between the first and second terminals is equal to or greater than a holding voltage that is less than the threshold voltage.

Example 30 is the system of Example 29, wherein the write operation is to write the data bit with the second logic value, and wherein the control circuit is to provide the bit line signal with the supply voltage during the write operation to write the data bit to the respective memory cell and after the write operation to retain the data bit in the respective memory cell.

Example 31 is the system of Example 30, wherein the supply voltage of the word line signal is to control the selector transistor to apply a first voltage to the threshold switch that is equal to or greater than the threshold voltage during the write operation, and wherein the intermediate voltage of the word line is to control the selector transistor to apply a second voltage to the threshold switch that is less than the threshold voltage to retain the data bit in the respective memory cell after the write operation.

Example 32 is the system of Example 31, wherein the second voltage is less than the holding voltage.

Example 33 is the system of Example 30, wherein, during a read operation to read the data bit from the respective memory cell, the bit line signal is to have a read voltage that is between the threshold voltage and the second voltage.

Example 34 is the system of any one of Examples 27 to 33, wherein the channel layer of the threshold switch includes: oxygen and further includes niobium, tantalum, vanadium, nickel, or hafnium; or a chalcogenide.

Example 35 is the system of Example 27, wherein the selector transistor is a front-end transistor.

Example 36 is the system of Example 27, wherein the selector transistor is a back-end transistor.

Example 37 is the system of any one of Examples 27 to 36, further comprising one or more of an antenna, a display, a network adapter, or a memory device coupled to the processor.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A memory circuit comprising:

a word line to receive a word line signal;

a bit line to receive a bit line signal;

a selector transistor having a gate terminal coupled to the word line, a source terminal coupled to the bit line, and a drain terminal; and a threshold switch having a channel layer between a first terminal and a second terminal, wherein the first terminal is coupled to the drain terminal of the selector transistor, and wherein the threshold switch is to switch from a high resistance state that represents a first logic value for a data bit to a low resistance state that represents a second logic value for the data bit when a voltage across the first and second terminals exceeds a threshold voltage and is to remain in the low resistance state after switching when the voltage across the first and second terminals is equal to or greater than a holding voltage that is less than the threshold voltage;

wherein, to write the data bit with the second logic value, the word line signal and the bit line signal are to control the selector transistor to apply a first voltage to the first terminal that is equal to or greater than the threshold voltage and then apply a second voltage to the first terminal that is less than the first voltage to maintain the threshold switch in the high resistance state, wherein the second voltage is less than the threshold voltage.

2. The memory circuit of claim 1, wherein the word line signal is to have a higher voltage to control the selector transistor to provide the first voltage than to control the selector transistor to provide the second voltage.

3. The memory circuit of claim 1, wherein, to read the data bit from the threshold switch, the bit line signal is to have a read voltage that is between the first voltage and the second voltage.

4. The memory circuit of claim 1, wherein the threshold switch is a two-terminal device including the first terminal and the second terminal.

5. The memory circuit of claim 4, wherein the channel layer of the threshold switch includes oxygen and further includes niobium, tantalum, vanadium, nickel, or hafnium.

6. The memory circuit of claim 5, wherein the channel layer of the threshold switch is doped with platinum, gold, silver, tantalum, or carbon.

7. The memory circuit of claim 4, wherein the channel layer of the threshold switch includes a chalcogenide including silicon, telluride, arsenic, antimony, or germanium.

8. The memory circuit of claim 1, further comprising a control circuit to provide the bit line signal to the bit line and the word line signal to the word line.

9. The memory circuit of claim 1, wherein the selector transistor is a front-end transistor.

10. The memory circuit of claim 1, wherein the selector transistor is a back-end transistor.

11. The memory circuit of claim 1, wherein the memory circuit is an embedded dynamic random access memory (eDRAM) circuit on a same die as logic transistors.

12. A memory circuit comprising:

a word line to receive a word line signal;

a bit line to receive a bit line signal;

a selector transistor having a gate terminal coupled to the word line, a source terminal coupled to the bit line, and a drain terminal; and a threshold switch having a channel layer between a first terminal and a second terminal, wherein the first terminal is coupled to the drain terminal of the selector transistor, and wherein the threshold switch is to switch from a high resistance state that represents a first logic value for a data bit to a low resistance state that represents a second logic value for the data bit when a voltage across the first and second terminals exceeds a threshold voltage and is to remain in the low resistance state after switching when the voltage across the first and second terminals is equal to or greater than a holding voltage that is less than the threshold voltage;

wherein the threshold switch is a two-terminal device including the first terminal and the second terminal, wherein the channel layer of the threshold switch includes oxygen and further includes niobium, tantalum, vanadium, nickel, or hafnium, and wherein the channel layer is doped with platinum, gold, silver, tantalum, or carbon.

13. The memory circuit of claim 12, further comprising a control circuit to provide the bit line signal to the bit line and the word line signal to the word line.

14. The memory circuit of claim 12, wherein the selector transistor is a front-end transistor.

15. The memory circuit of claim 12, wherein the selector transistor is a back-end transistor.

16. The memory circuit of claim 12, wherein the memory circuit is an embedded dynamic random access memory (eDRAM) circuit on a same die as logic transistors.

17. A memory circuit comprising:

a word line to receive a word line signal;

a bit line to receive a bit line signal;

a selector transistor having a gate terminal coupled to the word line, a source terminal coupled to the bit line, and a drain terminal; and a threshold switch having a channel layer between a first terminal and a second terminal, wherein the first terminal is coupled to the drain terminal of the selector transistor, and wherein the threshold switch is to switch from a high resistance state that represents a first logic value for a data bit to a low resistance state that represents a second logic value for the data bit when a voltage across the first and second terminals exceeds a threshold voltage and is to remain in the low resistance state after switching when the voltage across the first and second terminals is equal to or greater than a holding voltage that is less than the threshold voltage;

wherein the threshold switch is a two-terminal device including the first terminal and the second terminal, and wherein the channel layer of the threshold switch includes a chalcogenide including silicon, telluride, arsenic, antimony, or germanium.

18. The memory circuit of claim 17, further comprising a control circuit to provide the bit line signal to the bit line and the word line signal to the word line.

19. The memory circuit of claim 17, wherein the selector transistor is a front-end transistor.

20. The memory circuit of claim 17, wherein the selector transistor is a back-end transistor.

21. The memory circuit of claim 17, wherein the memory circuit is an embedded dynamic random access memory (eDRAM) circuit on a same die as logic transistors.

* * * * *